United States Patent
Wen et al.

(10) Patent No.: US 6,169,008 B1
(45) Date of Patent: Jan. 2, 2001

(54) HIGH Q INDUCTOR AND ITS FORMING METHOD

(75) Inventors: Wen-Ying Wen, Shin-Chu; Chih-Ming Chen, Tainan, both of (TW)

(73) Assignee: Winbond Electronics Corp., Hsinchu (TW)

(*) Notice: Under 35 U.S.C. 154(b), the term of this patent shall be extended for 0 days.

(21) Appl. No.: 09/166,680

(22) Filed: Oct. 5, 1998

(30) Foreign Application Priority Data

May 16, 1998 (TW) ................................................ 87107626

(51) Int. Cl.$^7$ .................................................. H01L 21/20
(52) U.S. Cl. .......................... 438/381; 257/531; 438/388; 438/243; 438/359
(58) Field of Search ........................... 257/531, 571, 257/595, 528; 438/386, 243, 359, 381, 388

(56) References Cited

U.S. PATENT DOCUMENTS

| | | | |
|---|---|---|---|
| 5,227,659 | * 7/1993 | Hubbard | 257/531 |
| 5,283,462 | * 2/1994 | Stengel | 257/595 |
| 5,446,311 | * 8/1995 | Ewen et al. | 257/531 |
| 5,545,916 | * 8/1996 | Koullias | 257/531 |
| 5,559,360 | * 9/1996 | Chiu et al. | 257/531 |
| 5,635,892 | * 6/1997 | Ashby et al. | 336/200 |
| 5,760,456 | * 6/1998 | Grzegorek et al. | 257/531 |
| 5,844,299 | * 8/1998 | Merril et al. | 257/531 |
| 5,861,647 | * 1/1999 | Zhao et al. | 257/296 |
| 5,943,581 | * 8/1999 | Lu et al. | 438/386 |

OTHER PUBLICATIONS

Optimization of High Integrated Inductors for Multi–Level Metal CMOS, Merrill et al., IEDM 95–983, pp. 38.71–38.74, Jan. 1995.*

* cited by examiner

*Primary Examiner*—Matthew Smith
*Assistant Examiner*—Belur Keshavan
(74) *Attorney, Agent, or Firm*—Ladas & Parry

(57) ABSTRACT

A high Q inductor and its forming method is disclosed. In this forming method, a semiconductor substrate is first provided with a trench formed thereon. The trench is defined by dry etching and formed to a depth of 3~5 μm. A material having a higher resistivity than that of the semiconductor is then provided to fill the trench. The material can be formed by first depositing an epitaxy layer with a lower dopant concentration than that of the semiconductor substrate by several orders of magnitude on the semiconductor substrate, then etching back the epitaxy layer to expose the surface of the semiconductor substrate. Thereafter, a dielectric layer is formed on the semiconductor substrate and the trench, and an inductor winding is formed on the dielectric layer above the trench to form the high Q inductor.

21 Claims, 3 Drawing Sheets

HIGH Q INDUCTOR AND ITS FORMING METHOD

GENERAL DESCRIPTION OF THE INVENTION

The present invention relates to an inductor, and in particular, to a high Q inductor and its forming method which first provides a trench on the semiconductor substrate by a basic process such as etching, then fills the trench with a high resistivity material, for example by depositing an epitaxy layer. Consequently, the substrate loss between the inductor winding and the semiconductor substrate due to the substrate resistance can be reduced by several orders of magnitude, greatly improving the quality factor of the formed inductor.

BACKGROUND TO THE INVENTION

Given of the rapid growth of wireless and RF communication markets, silicon has become as a crucial material to meet the demands of low-cost, high density integration technologies. For silicon wireless and RF IC applications, the realization of high quality factor (Q) inductors is an important task that calls for immediate attention. Generally speaking, the ratio of an inductor's reactance to its series resistance is used as a measure of the quality of the inductor. The quality factor is referred to as the Q of the inductor.

$$Q = \omega_0 * L/R$$

FIG. 1 (Prior Art) is a cross sectional view of a conventional inductor. In FIG. 1, a semiconductor substrate 10, such as a P type silicon substrate or an N type silicon substrate, is provided with an oxide layer 12, such as a thin silicon oxide layer, on its surface. The inductor winding formed of intermediate layer 14, such as another silicon oxide layer, and metal windings 16a, 16b on the intermediate layer 14, is provided on the oxide layer 12. The inductor winding is formed of multilevel interconnect with a protective layer (not shown) thereon to protect the formed inductor from being damaged.

FIG. 2 (Prior Art) is the equivalent circuit diagram of the conventional inductor as shown in FIG. 1. As shown in FIG. 2, the reactance and capacitance of the metal windings 16a, 16b are respectively represented as an inductor L and a resistor R. The couple effect between the metal windings 16a, 16b is represented as a capacitor $C_f$. The substrate effects between the metal windings 16a, 16b (input/output terminal) and the semiconductor substrate 10 (ground) are representively represented as a capacitor C1 and a resistor R1 as well as a capacitor C2 and a resistor R2.

In this example, to get high Q inductors on silicon wafers, the series resistance R is reduced and the inductance L is increased. In addition, the inductor losses should also be controlled to some extent. Since the substrate losses are an important factor in inductor losses and are inversely proportional to the substrate effect between the metal windings and the semiconductor substrate, the substrate resistors Rl, R2 are increased to reduce the substrate losses.

SUMMARY OF THE INVENTION

Therefore, an object of the present invention is to provide a high Q inductor and its forming method. According to the the present invention, a trench is first defined on the semiconductor substrate by dry etching to form an inductor thereon, then a high resistivity material is deposited to fill the trench. Therefore, the substrate resistance (R1, R2 in FIG. 2) between the metal windings and the semiconductor substrate can be increased by several orders of magnitude, greatly reducing the substrate losses to an equal extent.

To achieve the above-indicated object and others, the present invention provides a method for forming a high Q inductor. The forming method includes the steps of: defining a trench on the semiconductor substrate by dry etching, and filling the trench with a high resistivity material. The resistivity of the material should be higher than that of the semiconductor substrate, such as an epitaxy layer. The trench is filled with the epitaxy layer by first depositing an epitaxy layer on the semiconductor substrate and the trench, then etching back the epitaxy layer to expose the surface of the semiconductor substrate. Thereafter, a dielectric layer is deposited on the semiconductor substrate (including the trench) and a metal winding is deposited on the dielectric layer above the trench. In this method, the dopant concentration of the epitaxy layer is lighter than that of the semiconductor substrate by several orders of magnitude, so the resistivity thereof is far higher than that of the semiconductor substrate.

The present invention also provides a high Q inductor. The high Q inductor includes a semiconductor substrate, a dielectric layer and an inductor winding. In this inductor, the semiconductor substrate is provided with a trench formed thereon. In the trench is filled with a material having a higher resistivity than that of the semiconductor substrate. The dielectric layer is formed on the semiconductor substrate and the trench. And the inductor winding is formed on the dielectric layer above the trench to obtain the high Q inductor.

BRIEF DESCRIPTION OF THE DRAWINGS

The following detailed description, given by way of example and not intended to limit the invention solely to the embodiments described herein, will best be understood in conjunction with the accompanying drawings, in which.

DESCRIPTION OF THE EMBODIMENT

Figure 1:
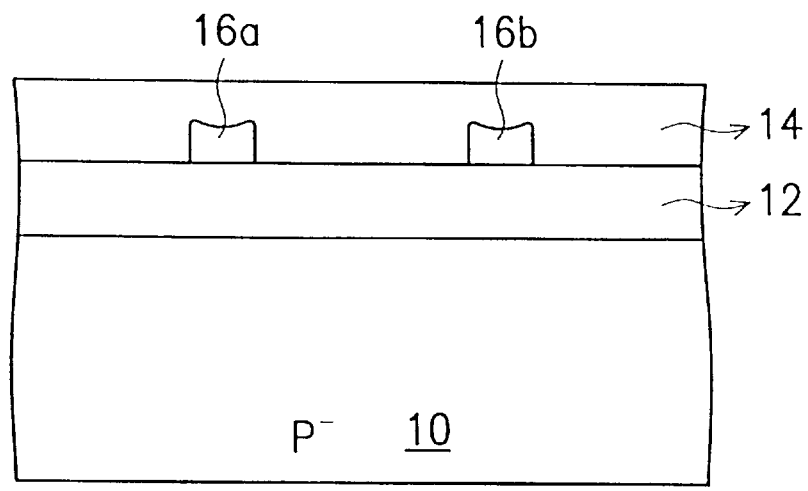
FIG. 1 (Prior Art) is a cross sectional view of a conventional inductor.
Figure 2:
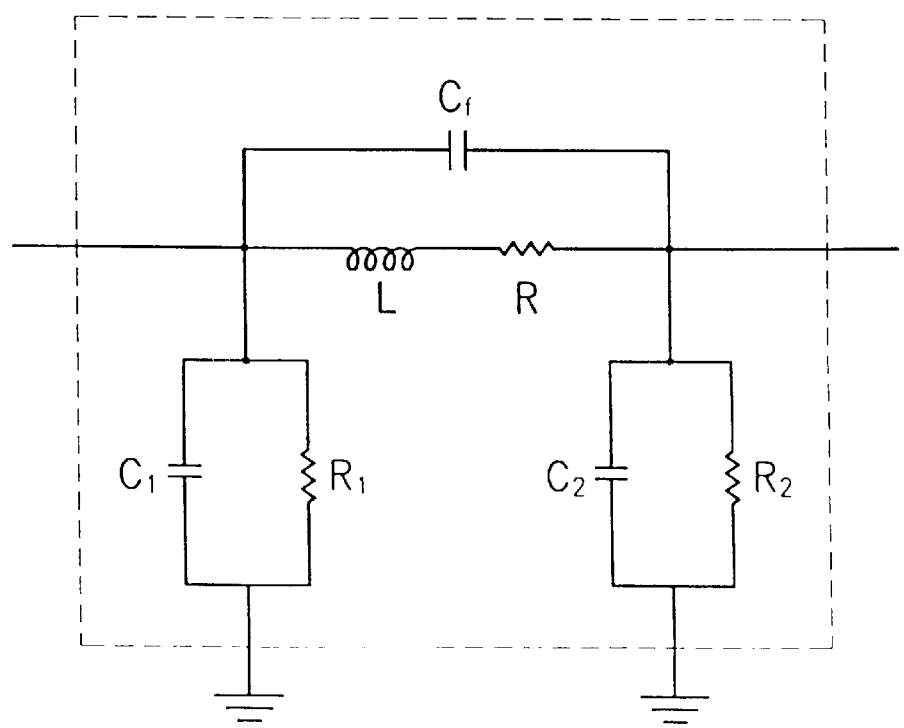
FIG. 2 (Prior Art) is an equivalent circuit diagram of the conventional inductor as shown in FIG. 1.

As shown in FIG. 1 and FIG. 2, in order to reduce the substrate effects of the metal windings 16a, 16b, the present invention employs STI technology to define a trench on the semiconductor substrate. The trench is filled with a high resistivity material, such as an epitaxy layer. Therefore, the resistivity between the metal windings and the semiconductor substrate (the substrate resistance R1, R2) is increased, and the substrate effects are greatly reduced.

FIG. 3A to FIG. 3D are cross sectional views showing the forming method, step by step, of the present invention. The detailed description follows hereafter.

Figure 3A:
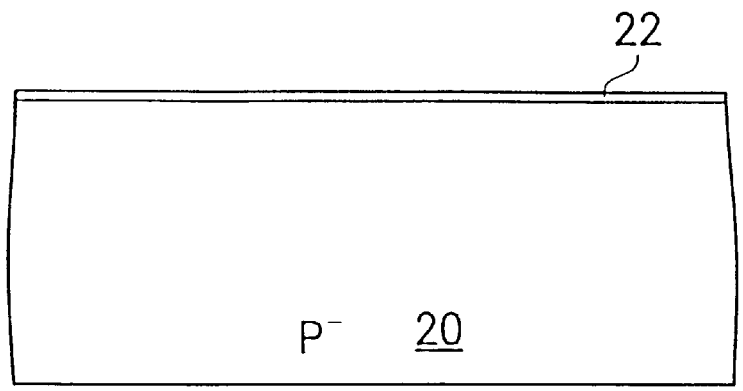
FIG. 3A to FIG. 3D are cross sectional views showing the forming method, step by step, of the present invention.

First, as shown in FIG. 3A, a semiconductor substrate 20, such as a P type silicon substrate or an N type silicon substrate of a resistivity of about 10 Ω-cm, is provided for the starting wafer. Then a thin oxide layer 22, such as an oxidized or CVD silicon oxide layer of a thickness of about 300~600 Å is deposited on the surface of the semiconductor substrate 20 to avoid pollution thereon.

Then, a trench is defined on the semiconductor substrate 20 using basic processes, such as etching and depositing, and the trench is filled with a high resitivity material.

Figure 3B:
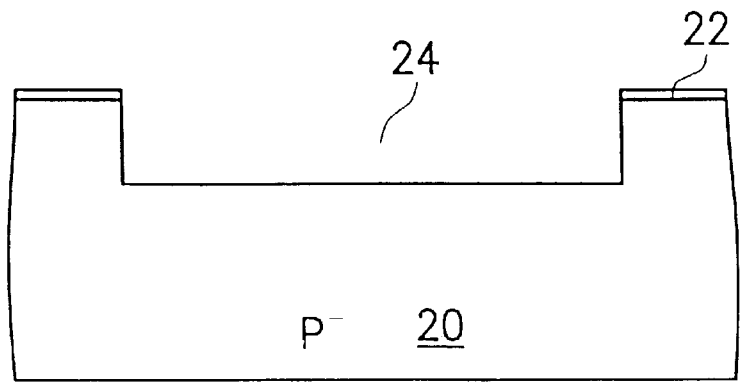

As shown in FIG. 3B, using a photoresist layer or a dielectric layer (not shown) as a mask, a trench 24 is defined on the semiconductor substrate 20 by dry etching or other methods. The area of the trench 24 is larger than that of the to-be-formed inductor, and the depth of the trench 24 ranges around 3~5 μm. In addition, the trench 24 is preferably located outside an active region of the semiconductor substrate 20 so as to avoid improper interference generated between the formed inductor and circuits in the active region.

Figure 3C:
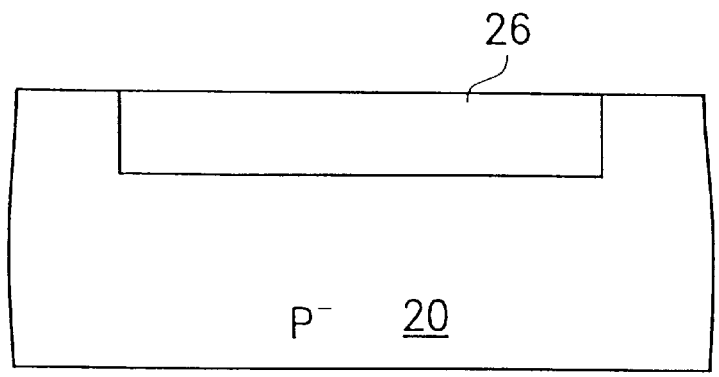

Thereafter, as shown in FIG. 3C, a high resistivity material 26 is deposited to fill the trench 24. The high resistivity material 26 can be an epitaxy layer or other silicon substrate with a low dopant concentration. The dopant concentration of the silicon substrate or the epitaxy layer can be lower than that of the semiconductor substrate by several orders of magnitude, depending on various situations, so as to increase the resistivity thereof by the same magnitude to several KΩ-cm. In this embodiment, the high resistivity material 26 is filled in the trench 24 by the steps of: first PVD/CVD depositing a low dopant concentration epitaxy layer or a silicon layer on the surface of the semiconductor substrate 20, and simutaneously filling the trench 24, then etching back the deposited material (such as the epitaxy layer 26 or the silicon layer) and the thin oxide layer 22 to expose the surface of the semiconductor substrate 20.

Figure 3D:
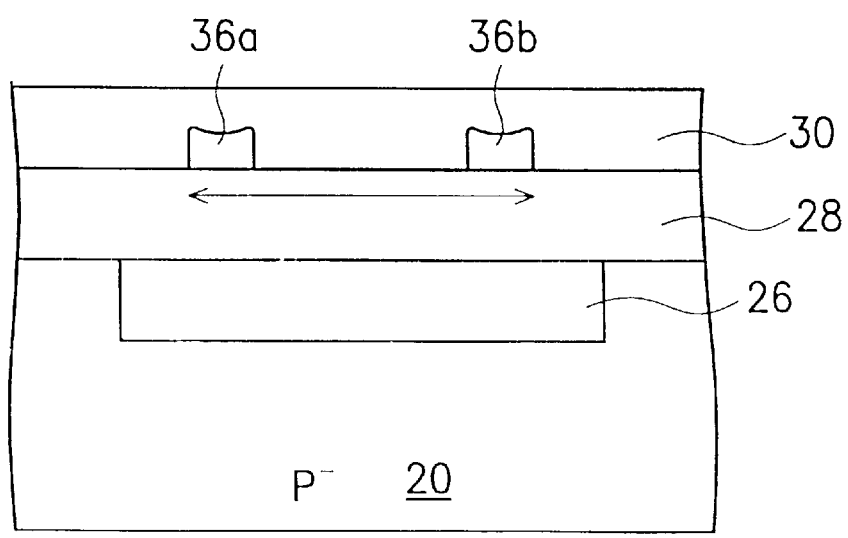

Afterwards, as shown in FIG. 3D, a dielectric layer 28 of about 10 microns is deposited on the semiconductor substrate 20, as well as the epitaxy layer 26 filling the trench 24. The dielectric layer 28 is planarized using CMP technology. Then, an inductor winding is formed on the dielectric layer 28 to accomplish the acquired inductor. In this step, the inductor winding can be formed of single-level interconnect or multilevel interconnect, such as the intermediate layer 30 and the metal layer 36a, 36b as shown in FIG. 3D. Further, another protective layer (not shown) can also be deposited on the inductor winding so as to protect the acquired inductor from being damaged.

In summation, the method of the present invention defines a trench filled with a high resistivity material, such as an epitaxy layer, on the semiconductor substrate, therefore the substrate effect (substrate resistance R1, R2) and the quality factor (Q) of the acquired inductor can be greatly improved. Further, the inductor obtained according to the present invention can be formed by using only basic processes, such as depositing and etching, therefore it is not difficult to manufacture such an inductor.

The foregoing description of a preferred embodiment of the present invention has been provided for the purposes of illustration and description only. It is not intended to be exhaustive or to limit the invention to the precise forms disclosed. Many modifications and variations will be apparent to practitioners skilled in this art. The embodiment was chosen and described to best explain the principles of the present invention and its practical application, thereby enabling those who are skilled in the art to understand the invention for various embodiments and with various modifications as are suited to the particular use contemplated. It is intended that the scope of the invention be defined by the following claims and their equivalents.

What is claimed is:

1. A method for forming a high Q inductor, comprising:
   providing a semiconductor substrate;
   forming a trench on the semiconductor substrate;
   filling the trench with a material having a higher resistivity than that of the semiconductor substrate;
   forming a dielectric layer on the semiconductor substrate and the trench filled with the material; and
   forming an inductor winding on the dielectric layer above the trench.

2. The method for forming the high Q inductor as claimed in claim 1, wherein the trench is filled with an epitaxial layer having a lower dopant concentration than that of the semiconductor substrate.

3. The method for forming the high Q inductor as claimed in claim 1, wherein the trench is defined by dry etching the semiconductor substrate.

4. The method for forming the high Q inductor as claimed in claim 1, wherein the trench is filled with the material by:
   depositing the material to cover the semiconductor substrate and fill the trench; and
   etching back the material to expose the surface of the semiconductor substrate.

5. The method for forming the high Q inductor as claimed in claim 1, wherein the dielectric layer is formed of an oxide layer.

6. The method for forming the high Q inductor as claimed in claim 1, wherein the inductor winding is formed of at least an intermediate layer and a metal layer defined thereon.

7. The method for forming high Q inductor as claimed in claim 1, wherein the trench is formed to a depth of 3~5 μm.

8. The method for forming the high Q inductor as claimed in claim 1, wherein the trench is formed on a surface of the semiconductor substrate.

9. The method for forming the high Q inductor as claimed in claim 1, wherein the trench is formed through patterning.

10. The method for forming the high Q inductor as claimed in claim 1, wherein the trench is formed before application of voltage to the inductor.

11. A high Q inductor, comprising:
    a semiconductor substrate with a trench formed thereon, the trench being filled with a material having a higher resistivity than that of the semiconductor substrate;
    a dielectric layer formed on the semiconductor substrate and the trench; and
    an inductor winding formed on the dielectric layer above the trench.

12. The high Q inductor as claimed in claim 11, wherein the trench is defined by dry etching the semiconductor substrate.

13. The high Q inductor as claimed in claim 11, wherein the material is an epitaxy layer with a lower dopant concentration than that of the semiconductor substrate.

14. The high Q inductor as claimed in claim 11, wherein the dielectric layer is an oxide layer.

15. The high Q inductor as claimed in claim 11, wherein the trench is 3~5 μm in depth.

16. The high Q inductor as claimed in claim 11, wherein the inductor winding comprises at least an intermediate layer and a metal layer defined thereon.

17. The high Q inductor as claimed in claim 11, wherein the trench is formed on a surface of the semiconductor substrate.

18. The high Q inductor as claimed in claim 11, wherein the trench is formed through patterning.

19. The high Q inductor as claimed in claim 11, wherein the trench is formed before application of voltage to the inductor.

20. A method for forming a high Q inductor, comprising:

providing a semiconductor substrate;

forming a trench with a depth of 3~5 µm on the semiconductor substrate;

filling the trench with a material having a higher resistivity than that of the semiconductor substrate;

forming a dielectric layer on the semiconductor substrate and the trench filled with the material; and forming an inductor winding on the dielectric layer above the trench.

21. A high Q inductor, comprising:

a semiconductor substrate with a trench formed thereon, the trench being 3~5 µm in depth and being filled with a material having a higher resistivity than that of the semiconductor substrate;

a dielectric layer formed on the semiconductor substrate and the trench; and an inductor winding formed on the dielectric layer above the trench.

* * * * *